(12) United States Patent
Zhou et al.

(10) Patent No.: US 10,421,890 B2
(45) Date of Patent: Sep. 24, 2019

(54) COMPOSITE PARTICLES, METHOD OF REFINING AND USE THEREOF

(71) Applicant: Versum Materials US, LLC, Allentown, PA (US)

(72) Inventors: Hongjun Zhou, Chandler, AZ (US); John Edward Quincy Hughes, Cave Creek, AZ (US); Krishna P. Murella, Phoenix, AZ (US); Reinaldo Mario Machado, Phoenix, AZ (US); Mark Leonard O'Neill, Queen Creek, AZ (US); Dnyanesh Chandrakant Tamboli, Gilbert, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/462,463

(22) Filed: Mar. 17, 2017

(65) Prior Publication Data

US 2017/0283673 A1    Oct. 5, 2017

Related U.S. Application Data

(60) Provisional application No. 62/316,089, filed on Mar. 31, 2016.

(51) Int. Cl.
| | |
|---|---|
| *B24B 37/04* | (2012.01) |
| *C09G 1/00* | (2006.01) |
| *C09G 1/02* | (2006.01) |
| *C09K 3/14* | (2006.01) |
| *H01L 21/302* | (2006.01) |

(Continued)

(52) U.S. Cl.
CPC .......... *C09K 3/1436* (2013.01); *B24B 37/044* (2013.01); *C09G 1/00* (2013.01); *C09G 1/02* (2013.01); *C09K 3/14* (2013.01); *C09K 3/1409* (2013.01); *C09K 3/1454* (2013.01); *C09K 3/1463* (2013.01); *H01L 21/302* (2013.01); *H01L 21/304* (2013.01); *H01L 21/30625* (2013.01); *H01L 21/31053* (2013.01); *H01L 21/3212* (2013.01); *H01L 21/461* (2013.01); *H01L 21/463* (2013.01)

(58) Field of Classification Search
None
See application file for complete search history.

(56) References Cited

U.S. PATENT DOCUMENTS

| | | | | |
|---|---|---|---|---|
| 2002/0003225 | A1* | 1/2002 | Hampden-Smith | B01J 2/003 252/79.1 |
| 2003/0118824 | A1* | 6/2003 | Tokarz | B82Y 30/00 428/404 |

(Continued)

FOREIGN PATENT DOCUMENTS

| | | |
|---|---|---|
| EP | 0810181 A2 | 12/1997 |
| EP | 1061111 A1 | 12/2000 |

(Continued)

*Primary Examiner* — Stephanie P Duclair
(74) *Attorney, Agent, or Firm* — Lina Yang

(57) ABSTRACT

Composite particles with lower mean particle size and smaller size distribution are obtained through refining treatments. The refined composite particles, such as ceria coated silica particles are used in Chemical Mechanical Planarization (CMP) compositions to offer higher removal rate; very low within wafer (WWNU) for removal rate, low dishing and low defects for polishing oxide films.

11 Claims, 3 Drawing Sheets

(51) Int. Cl.
   *H01L 21/304*     (2006.01)
   *H01L 21/306*     (2006.01)
   *H01L 21/3105*    (2006.01)
   *H01L 21/321*     (2006.01)
   *H01L 21/461*     (2006.01)
   *H01L 21/463*     (2006.01)

(56) References Cited

U.S. PATENT DOCUMENTS

| | | | |
|---|---|---|---|
| 2007/0218811 A1* | 9/2007 | Kurata | C09G 1/02 451/28 |
| 2010/0248593 A1 | 9/2010 | Sakai et al. | |
| 2012/0077419 A1 | 3/2012 | Zhang et al. | |
| 2014/0051250 A1 | 2/2014 | Minami et al. | |
| 2014/0315386 A1 | 10/2014 | Zhou et al. | |

FOREIGN PATENT DOCUMENTS

| | | |
|---|---|---|
| EP | 1542266 A1 | 6/2005 |
| EP | 2818526 A1 | 12/2014 |
| JP | 2006100713 | 4/2006 |
| JP | 2013008751 | 1/2013 |
| JP | 201319131 A2 | 6/2013 |
| JP | 2013208688 | 10/2013 |
| WO | 03054096 A1 | 7/2003 |
| WO | 2010139603 A1 | 12/2010 |
| WO | 2015200684 A1 | 12/2015 |

* cited by examiner

COMPOSITE PARTICLES, METHOD OF REFINING AND USE THEREOF

CROSS-REFERENCE OF RELATED APPLICATIONS

This application claims the benefit of priority to U.S. provisional application Ser. No. 62/316,089, filed Mar. 31, 2016, which is incorporated herein by reference in its entirety.

BACKGROUND OF THE INVENTION

Chemical mechanical planarization ("CMP") polishing compositions (CMP slurries, CMP composition or CMP formulations are used interchangeably) are used in the production of a semiconductor device. The present invention relates to polishing compositions comprising refined composite particles (used as abrasive particles) that are especially suitable for polishing patterned semiconductor wafers that comprise silicon oxide materials.

Silicon oxide is widely used as dielectric materials in semiconductor industry. There are several CMP steps in integrated circuit (IC) manufacturing process, such as shallow trench isolation (STI), inter-layer dielectric (ILD) CMP and gate poly CMP etc. Typical oxide CMP slurry involves: abrasive, with or without other chemicals. Other chemicals could be dispersants to improve slurry stability, boosters to increase removal rate, or inhibitors to decrease removal rate and to stop on the other film, for example, SiN for STI application.

Desirable characteristics for a CMP slurry at advanced semiconductor technology nodes are reduced defects, high removal rates, very low with wafer non uniformity (WWNU) for removal rates and low topography. Having a very low WWNU for removal rates is particularly important. A higher non-uniformity would lead to over-polish in the regions on the wafers where removal rates and under-polish where least material is removed. This would create uneven topography on the wafer surface which is undesirable in semiconductor manufacturing. Therefore, considerable CMP process development is required in terms of pads, conditioning, polishing zone pressure adjustments to yield desired uniform removal rate profile.

Among common abrasives used in CMP slurries, such as silica, alumina, zirconia, titania and so on, ceria is well-known for its high reactivity toward silica oxide and is widely used in STI CMP slurry for the highest oxide removal rate (RR) due to the high reactivity of ceria to silica.

Cook et al. (Lee M. Cook, Journal of Non-Crystalline Solids 120 (1990) 152-171) proposed a 'chemical tooth' mechanism to explain this extraordinary property of ceria. According to this mechanism, when ceria particles are pressed onto silicon oxide film, ceria breaks down silica bonds, forms a Ce—O—Si structure and thus cleavage silica from the surface.

Most of the ceria used in CMP industry are manufactured from calcinations-wet milling process. The resulted ceria has sharp edges and very wide size distribution. It also has very large "large particle count" (LPC). All of these are believed to be responsible for defects and low yields, especially scratch after the wafer is polished. Different forms of ceria containing particles such as colloidal ceria or ceria coated silica particles are also being considered to resolve these challenging issues.

Ceria coated silica particles have been found especially useful for achieving high removal rates of silicon oxide films with lower defectivity (PCT/US16/12993). Yet the need exists still to further improve the removal rates, control the removal rate within-wafer-non-uniformity (WWNU) and reduce polishing defects.

The present invention relates to refined agglomerated composite particles, methods of refinement and method of using the refined composite particles in polishing applications that can achieve the performance requirements.

Therefore, there are significant needs for CMP compositions, methods, and systems that can offer excellent within wafer non-uniformity for removal rates and higher removal rates and low defects.

BRIEF SUMMARY OF THE INVENTION

Described herein are refined composite particles, method of refining and use thereof.

In one aspect, the present invention is composite particles comprise single ceria coated silica particles and aggregated ceria coated silica particles; wherein more than 99 wt % of the composite particles comprising the number of single ceria coated silica particles ranging from 10 or less (≤10) to 2 or less (≤2), such as ≤10, ≤5, ≤4, ≤3, and ≤2.

In another aspect, the present invention is a process of refining composite particles comprising single and aggregated particles to reduce large aggregates, comprising at least one step selected from the group consisting of (1) filtration; (2) bowl centrifuge; (3) fixed angle rotational centrifuge; (4) gravitational settling; (5) calcination and milling process modifications; and combinations thereof; wherein the single particles comprising core particles with surfaces covered by nanoparticles; wherein the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof.

In yet another aspect, the present invention is a chemical mechanical planarization (CMP) polishing composition, comprising
- composite particles comprise single ceria coated silica particles and aggregated ceria coated silica particles; wherein more than 99 wt % of the composite particles comprising of ≤5, preferably ≤4, or more preferably ≤2 single ceria coated silica particles;
- water;
- pH of the CMP composition ranges from about 2 to about 12, preferably about 3.5 to about 10, more preferably from about 4 to about 7;
- and
- optionally
- a pH adjusting agent;
- a surfactant; and
- biological growth inhibitor.

In yet another aspect, the present invention is a polishing method for chemical mechanical planarization (CMP) of a semiconductor substrate comprising at least one surface having at least one oxide layer, comprising the steps of:
a) contacting the at least one oxide layer with a polishing pad;
b) delivering a CMP polishing composition to the at least one surface, and
c) polishing the at least one oxide layer with the CMP polishing composition;

wherein the CMP polishing composition comprises
composite particles comprise single ceria coated silica particles and aggregated ceria coated silica particles; wherein more than 99 wt % of the composite particles comprising of ≤5, preferably ≤4, or more preferably ≤2 single ceria coated silica particles;
water;
pH of the CMP composition ranges from about 2 to about 12, preferably about 3.5 to about 10, more preferably from about 4 to about 7;
and
optionally
a pH adjusting agent;
a surfactant; and
biological growth inhibitor.

In yet another aspect, the present invention is a system for chemical mechanical planarization, comprising:
a semiconductor substrate comprising at least one surface having at least one oxide layer;
a polishing pad; and
a CMP polishing composition;
wherein
the at least one oxide layer is in contact with the polishing pad and the polishing composition; and
the CMP polishing composition comprises
composite particles comprise single ceria coated silica particles and aggregated ceria coated silica particles; wherein more than 99 wt % of the composite particles comprising of ≤5, preferably ≤4, more preferably ≤2 single ceria coated silica particles;
water;
pH of the CMP composition ranges from about 2 to about 12, preferably about 3.5 to about 10, more preferably from about 4 to about 7;
and
optionally
a pH adjusting agent;
a surfactant; and
biological growth inhibitor.

The pH adjusting agent includes but is not limited to sodium hydroxide, cesium hydroxide, potassium hydroxide, cesium hydroxide, ammonium hydroxide, quaternary organic ammonium hydroxide, and combinations thereof;

The chemical additive includes but is not limited to a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;

The composite particles can comprise single ceria coated silica particles and aggregated ceria coated silica particles; wherein 99 wt % of the composite particles have particle size less than 250 nm, preferably less than 200 nm, and more preferably less than 190 nm.

The ceria coated silica particles can further have mean particle size less than 150 nm, preferably less than 125 nm, or more preferably less than 110 nm; wherein the mean particle size is the weighted average of particle diameters.

The ceria coated silica particles are amorphous silica ceria particles having surfaces covered by singly crystalline ceria nanoparticles.

The change of size distribution of composite particles under a disintegrative force is less than 10%, preferably less than 5%, or more preferably less than 2%.

When the semiconductor substrate further comprising a nitride layer, the CMP polishing provides a removal selectivity of the at least one oxide layer over the nitride layer is more than 10. The removal selectivity of TEOS over silicon nitride layer is more than 20.

DETAILED DESCRIPTION OF THE INVENTION

Composition Particles

Figure 1:
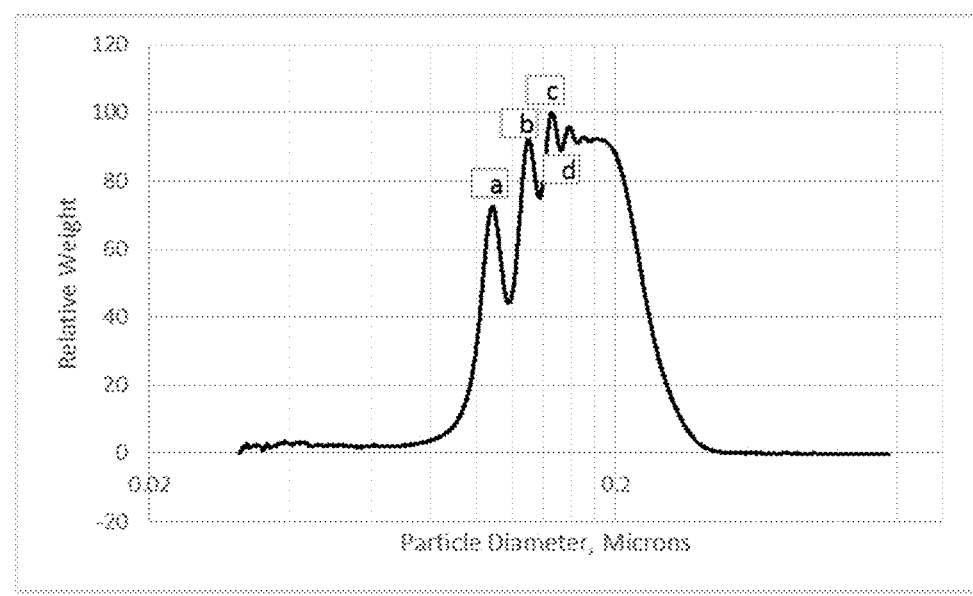
FIG. 1 shows the particle size distribution of clusters of single ceria coated silica particles by Disc Centrifuge Particle Size Analyzer.

Composite particles contain primary (or single) particles and aggregated primary (or single) particles. A primary particle has a core particle and many nanoparticles covering the surface of the core particle.

The core particle is selected from the group consisting of silica, alumina, titania, zirconia, and polymer particle. The nanoparticles are selected from the group consisting of oxides of zirconium, titanium, iron, manganese, zinc, cerium, yttrium, calcium, magnesium, fluorine, lanthanum and strontium nanoparticles. One of the examples of the composite particles is to have silica as the core particles and ceria as the nanoparticles; and each silica core particle has ceria nanoparticles covering its shell. The surface of each silica particle is covered by ceria nanoparticles. The silica base particles are amorphous; and the ceria nanoparticles are singly crystalline.

The primary particle can have an amorphous oxide layer including at least one type of element among aluminum, zirconium, titanium, iron, manganese, zinc, cerium, yttrium, calcium, magnesium, fluorine, lanthanum silicon, and strontium on the surface of an amorphous silica particle A, and a crystalline oxide layer B including at least one type of element selected from among zirconium, titanium, iron, manganese, zinc, cerium, yttrium, calcium, magnesium, fluorine, lanthanum and strontium thereupon. The nanoparticles covering the silica core particles may also have a thin layer of silicon containing films covering the surface either partially or fully.

Ceria coated silica particles can be made using any suitable methods. For example, methods to make such particles are described in PCT/JP2016/060535, JP20131191131, JP2013133255, JP2015-169967, and JP2015-183942.

Typically, the method of forming composite particles, such as, ceria coated silica particles involves deposition of cerium compounds on silica core particles, followed by a calcination step and a milling step. However, the calcination step results in agglomeration of particles. Some of the examples ways to reduce the number of aggregated particles would be to use lower calcination conditions such as lower temperature or calcination time, more aggressive milling conditions, use of dispersants during milling, use of postmilling processing such as centrifugation or filtering or any other technique that reduces the number of aggregated particles The amount of nanoparticles covering the surface of the core particles preferably falls within the following range in terms of the solid weight ratio. The solid weight (b) of the nanoparticles relative to the solid weight (a) of the core particles is (b)/(a)=0.01 to 2, preferably 0.25 to 1.5, or most preferably between 0.5 and 1.3.

Diameter of the ceria nanoparticles covering the core particle is more than 1 nm, or preferably greater than 10 nm, preferably more than 13 nm. Having larger ceria particle diameter would allow higher removal rate to be possible.

Diameter of the core particles may range from 10 nm to 500 nm, preferably between 20 nm to 200 nm, most preferably between 50 nm and 150 nm. The core particles are larger than the nanoparticles.

Typically, the method of forming ceria coated silica particles involves deposition of cerium compounds on silica core particles, followed by a calcination step and a milling step. However, the calcination step results in agglomeration of particles. These agglomerated particles are made of clusters of primary particles.

Each of the primary (or single) particles is spherical and uniform in size and may have a diameter between 50 and 300 nm.

The primary (or single) particles can be physically bonded into cohesive organized clusters to form agglomerated particles. The clusters contain 2 to 50 primary (or single) particles.

The agglomerated particles have a continuous distribution in size from individual primary particles up to clusters containing 50 primary particles.

The mean particle size is the weighted average of particle diameters. For example, $$\text{Weight average mean particle size} = (W1*D1 + W2*D2 + \ldots Wn*Dn)/(W1+W2+\ldots Wn);$$

where $W1, W2 \ldots Wn$: weight fractions of particles in particle size bins defined by particle diameters $D1, D2, \ldots Dn$.

The size distribution of agglomerated particles is distinguished in a weight % versus particle diameter profile such that individual peaks or local maximum are determined by the hydraulic diameter of the clusters.

The size distribution of agglomerated particles can be determined by using suitable particle size measurement techniques such as disc centrifuge (DC), dynamic light scattering (DLS), Single Particle Optical Sizing (SPOS), electron microscopy. Preferred method for characterization of particle size distribution are techniques based on Disc Centrifuge (DC).

FIG. 1 shows a typical size distribution of agglomerated ceria coated silica particles by Disc Centrifuge Particle Size Analyzer. The characteristic peaks for the particle clusters are also shown in FIG. 1.

The peaks followed a pattern where the hydraulic diameter of each subsequent cluster, made up of n primary particles, is given by:

$$\text{Diameter of the cluster} = \text{Diameter of the primary particle} \times n^a$$

where n=number of primary particles in the cluster and $\frac{1}{4} < a < \frac{1}{3}$.

The reduction in the number of aggregated particles can be achieved by using any one and any combinations of (1) Filtration; (2) Bowl Centrifuge; (3) Fixed angle rotational Centrifuge; (4) Gravitational settling; and (5) Optimization of calcination and milling processes.

The reduction in the number of aggregated particles can also be determined by using suitable particle size measurement techniques such as disc centrifuge (DC), dynamic light scattering (DLS), Single Particle Optical Sizing (SPOS), electron microscopy. Preferred method for characterization of particle size distribution are techniques based on Disc Centrifuge (DC).

Another aspect of the refined ceria coated silica particles is that they do not disintegrate under disintegrative forces. Particle stability under disintegrative forces can be determined by subjecting the formulation to the ultrasonication treatment for half an hour and measuring the changes in size distribution. Preferred conditions for ultrasonication treatment are ½ hour immersion in bath with 42 KHZ frequency at 100 W output. Particle size distribution can be measured by using any suitable technique such as Disc Centrifuge (DC) method or Dynamic Light Scattering (DLS).

Changes in size distribution after the ultrasonication treatment can be characterized in terms of changes in mean particle size, or D50 (50 wt % particles below this size and 50 wt % larger than this size), or D99 (99 wt % particles below this size and 1 wt % larger than this size) or any similar parameters.

Preferably the changes in particle size distribution of ceria coated silica particles after ultrasonication treatment is less than 10%, preferably less than 5%, or more preferably less than 2%; by using for example DC and mean particle size, D50, D75 and/or D99.

Chemical Mechanical Planarization (CMP)

The refined aggregated particles can be used as abrasive particles in CMP compositions (or CMP slurries, or CMP formulations).

An example is STI (Shallow Trench Isolation) CMP formulations, to polish oxide films, such as various metal oxide films; and various nitride films. In STI formulations, the formulations comprising silica coated ceria composite particles can provide very high removal rates of silicon oxide films and very low removal rates of silicon nitride polish stop films. These slurry formulations can be used to polish a variety of films and materials including but not limited to thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), polymer films, flowable Chemical Vapor Deposited (CVD) films, optical glass, display glass.

The formulations can also be used in stop-in-film applications, where the polishing is stopped once the topography is removed and a flat surface is achieved. Alternatively, these formulations can be used in applications that involve polishing the bulk film and stopping at a stopper layer. These formulations can be used in a variety of applications including but not limited to Shallow Trench Isolation (STI), Inter Layer Dielectric (ILD) polish, Inter Metal Dielectric (IMD) polish, through silicon via (TSV) polish, poly-Si or amorphous-Si film polishing, SiGe films, Ge films and III-V semiconductor films.

The formulations may also be used in any other applications such as glass polishing or solar wafer processing or wafer grinding where high removal rates are desired.

In certain embodiments, polishing formulations can be used to polish silicon oxide films at polish rates greater than 2000 Angstroms/min while having polish rates of silicon nitride and poly-Si films less than 160 Angstroms/min.

In some other embodiments, removal rate selectivity between silicon oxide films and poly-Si films may be between 1:4 and 4:1.

By reducing the number of clusters which have large number of primary particles in the CMP slurries, significant and unexpected improvement can be seen in terms of high removal rates, very low within wafer (WWNU) for removal rate, a flat removal rate profile, low dishing and low defects.

In one embodiment, CMP polishing composition comprise ceria coated silica particles with D99 is less than 250 nm or preferably less than 200 nm, where D99 is defined as the particle size threshold at which 99% of the total particles by weight have particle size smaller than D99 and 1% of the total particles have particle size larger than D99 based on particle size distribution as measured by Disk Centrifuge (DC) particle size analysis.

In another embodiment, CMP polishing composition comprise ceria coated silica particles with mean particle size as measured by Disc Centrifuge particle size analysis is less than 150 nm or preferably less than 125 nm or more preferably less than 110 nm.

In another embodiment CMP polishing composition comprise ceria coated silica particles with mean particle size as measured by Disc Centrifuge particle size analysis is less than 150 nm or preferably less than 125 nm or more preferably less than 110 nm and D99 is less than 250 nm or preferably less than 200 nm.

In another embodiment CMP polishing composition comprise ceria coated silica particles with mean particle size as measured by Disc Centrifuge particle size analysis is less than 150 nm or preferably less than 125 nm or more preferably less than 110 nm and D99 is less than 250 nm or preferably less than 200 nm and show a change of size distribution of particles under a disintegrative force of less than 10%.

In another embodiment the CMP polishing composition comprise ceria coated silica particles which have less than 1% by weight of the total particles are aggregates comprising of 5 or more primary ceria coated silica particles. A primary ceria coated silica particle is a single, non-aggregated ceria coated silica particle.

In certain embodiments, CMP formulations comprise ceria coated silica particles with particle refinement such that the number of aggregate clusters comprising at least 5 particles constitute less than 1 wt % of the total weight of particles as measured by Disc Centrifuge (DC) or preferably the number of aggregate clusters comprising at least 4 particles constitute less than 1 wt % of the total weight of particles as measured by Disc Centrifuge (DC) or even more preferably the number of aggregate clusters comprising at least 3 particles constitute less than 1 wt % of the total weight of particles as measured by Disc Centrifuge (DC). In most preferred refinement, entire particle distribution would comprise mostly of non-aggregated primary composite particles with number of aggregate clusters comprising at least 2 particles constitute less than 1 wt % of the total weight of particles as measured by Disc Centrifuge (DC).

In some embodiments, CMP formulations comprise ceria coated silica particles with particle refinement such that the number of aggregate clusters comprising 2 or less (≤2), primary particles constitute more than 85 wt % of the total weight of particles as measured by Disc Centrifuge (DC) or more preferably the number of aggregate clusters comprising 2 or less primary particles constitute more than 90 wt % of the total weight of particles as measured by Disc Centrifuge (DC) or even more preferably the number of aggregate clusters comprising 2 or less primary particles constitute more than 95 wt % of the total weight of particles as measured by Disc Centrifuge (DC). In most preferred refinement, entire particle distribution would comprise mostly of non-aggregated primary composite particles with number of aggregate clusters comprising 2 or less primary particles constitute more than 99 wt % of the total weight of particles as measured by Disc Centrifuge (DC).

In some embodiments, the ratio of D99 to the core particle size (as measured by measuring average diameter of core particles by transmission electron microscopy) is more preferably less than 3 or most preferably less than 2.

In another embodiment CMP slurry formulation comprise ceria coated silica particles which have been refined such that the mean particle size as measured by Disc Centrifuge particle size analysis after the refinement is reduced by at least 25 nm or more preferably more than 35 nm relative to the unrefined particles.

In another embodiment, a particle size distribution refinement method is used to reduce the number of large aggregates in ceria coated silica particles used in CMP formulations. Methods of particle size distribution refinement could include centrifugation, gravitational settling, and optimization of calcination and milling of ceria coated silica particles.

In another embodiment, described herein is a system for chemical mechanical planarization, comprising: a semiconductor substrate comprising at least one surface having at least one oxide layer; polishing pad; and a polishing composition comprising: ceria coated silica particles D99 is less than 250 nm or preferably less than 200 nm.

In another embodiment, described herein is a system for chemical mechanical planarization, comprising: a semiconductor substrate comprising at least one surface having at least one oxide layer; polishing pad; and a polishing composition comprising: ceria coated silica particles D99 is less than 250 nm or preferably less than 200 nm and show a change of size distribution of particles under a disintegrative force of less than 10%.

In another embodiment, described herein is a system for chemical mechanical planarization, comprising: a semiconductor substrate comprising at least one surface having at least one silicon oxide layer; polishing pad; and a polishing composition comprising: ceria coated silica particles which have less than 1% by weight of the total particles are aggregates comprising of 4 or more or 5 or more primary particles (single, non-aggregated ceria coated silica particles).

In another embodiment, described herein is a system for chemical mechanical planarization, comprising: a semiconductor substrate comprising at least one surface having at least one oxide layer; polishing pad; and a polishing composition comprising: ceria coated silica particles with Mean Particle Size as measured by Disc Centrifuge particle size analysis is less than 150 nm or preferably less than 125 nm or more preferably less than 110 nm.

In another embodiment, described herein is a system for chemical mechanical planarization, comprising: a semiconductor substrate comprising at least one surface having at least one silicon oxide layer; polishing pad; and a polishing composition comprising: ceria coated silica particles with Mean Particle Size as measured by Disc Centrifuge particle size analysis is less than 150 nm or preferably less than 125 nm or more preferably less than 110 nm; and D99 is less than 250 nm or preferably less than 200 nm.

Another aspect of use of ceria coated silica particles that do not disintegrate under polishing forces. It is hypothesized that if the particles do not breakdown under the action of polishing forces (i.e. disintegrative forces) and keep the characteristic of original particle size, then the removal rate would remain high. If the particles on the other hand disintegrate under polishing forces, the removal rate would decrease as the ceria nanoparticles on the surface responsible for high removal rates may come loose. Breaking of the particles may also yield irregular shaped particles which potentially have undesirable effect on scratching defects.

Using such stable particles in CMP slurry formulations would allow more effective utilization of polishing forces for film material removal and would also prevent generation of any irregular shapes that would contribute to scratching defects Since advanced CMP applications require extremely low levels of metals such as sodium on the dielectric surface after polishing, it is desired to have very low trace metals, especially sodium in the slurry formulations. In certain preferred embodiments the formulations comprise ceria coated silica particles that have less than 5 ppm, more preferably less than 1 ppm most preferably less than 0.5 ppm of sodium impurity levels for each percent of particles in the formulations by weight.

The CMP composition comprises refined composite particles as abrasive particles, a pH adjusting agent that is used to adjust pH of the CMP composition to the optimized pH condition; a suitable chemical additive to enhance/suppress the removal rate of polish designed film/stop layer; and the remaining being water.

The abrasive is present in an amount from 0.01 wt % to 20 wt %, preferably, from 0.05 wt % to 5 wt %, more preferably, from about 0.1 wt % to about 1 wt %.

Chemical additive includes, but is not limited to a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof.

The amount of chemical additive ranges from about 0.1 ppm (or 0.000001 wt %) to 0.5 wt % relative to the total weight of the barrier CMP composition. The preferred range is from about 200 ppm (or 0.02 wt %) to 0.3 wt % and more preferred range is from about 500 ppm (or 0.05 wt %) to 0.15 wt %.

The pH-adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures thereof.

The amount of pH-adjusting agent ranges from about 0.0001 wt % to about 5 wt % relative to the total weight of the CMP composition. The preferred range is from about 0.0005% to about 1 wt %, and more preferred range is from about 0.0005 wt % to about 0.5 wt %

The pH of the CMP composition ranges from 2 to about 12; preferably about 3.5 to about 10; more preferably from about 4 to about 7.

For certain CMP applications such as Shallow Trench Isolation (STI) or oxide polish for 3D-NAND devices, it may be desirable to polish using CMP formulations preferably in the range of 3 to 8 or most preferably between 4 to 7 in order to reduce dishing in the oxide line features as well as to reduce loss of silicon nitride stopping layers. For certain applications such as barrier metal polishing, the desirable pH range may be 5 to 12, or more preferably between 8 to 11.

The CMP composition may comprise a surfactant or mixture of surfactants. Surfactant may be selected from groups comprising a). Non-ionic surfactants; b). Anionic surfactants; c). Cationic surfactants; d). ampholytic surfactants; and mixtures thereof.

Non-ionic surfactants may be chosen from a range of chemical types including but not limited to long chain alcohols, ethoxylated alcohols, ethoxylated acetylenic diol surfactants, polyethylene glycol alkyl ethers, propylene glycol alkyl ethers, glucoside alkyl ethers, polyethylene glycol octylphenyl ethers, polyethylene glycol alkylphenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting agents include, but are not limited to potassium, ammonium and other positive ions. The molecular weights of these anionic surface wetting agents range from several hundred to several hundred-thousands.

Cationic surface wetting agents possess the positive net charge on major part of molecular frame. Cationic surfactants are typically halides of molecules comprising hydrophobic chain and cationic charge centers such as amines, quaternary ammonium, benzyalkonium and alkylpyridinium ions.

Yet, in another aspect, the surfactant can be an ampholytic surface wetting agents possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof. Examples of suitable commercially available surfactants include TRITON™, Tergitol™, DOWFAX™ family of surfactants manufactured by Dow Chemicals and various surfactants in SUIRFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals.

Other surfactants that have functions of dispersing agents and/or wetting agents include, but are not limited to, polymeric compounds which may have anionic or cationic or nonionic or zwitterionic characteristics. Examples are polymers/copolymers containing functional groups such as acrylic acid, maleic acid, sulfonic acid, vinyl acid, ethylene oxide, etc.

The amount of surfactant ranges from about 0.0001 wt % to about 10 wt % relative to the total weight of the CMP composition. The preferred range is from about 0.001 wt % to about 1 wt %, and more preferred range is from about 0.005 wt % to about 0.1 wt %.

Formulations may also comprise water soluble polymers which may comprise anionic or cationic or non-ionic or combinations of groups. The polymer/copolymer has molecular weights greater than 1,000, ranging preferably from 10,000 to 4,000,000; and more preferably from 50,000 to 2,000,000. Polymers can be selected from a group of polymers including, but not limited to poly(acrylic acid), poly(meth-acrylic acid), poly(2-acrylamido-2-methyl-1-propanesulfonic acid, carboxymethyl cellulose, methyl cellulose, hydroxypropyl methyl cellulose, poly-(1-vinylpyrrolidone-co-2-dimethylaminoethyl methacrylate). Polymer concentration in the CMP formulation may be in the range of 0.001 wt % to 5 wt % or more preferably between 0.005 wt % to 2 wt % or most preferably between 0.01 wt % and 1 wt %.

Chelators, or chelating ligands may also be used to enhance affinity of chelating ligands for metal cations especially in the applications involving polishing of metallic films. Chelating agents may also be used to prevent build-up of metal ions on pads which causes pad staining and instability in removal rates. Suitable chelators, or chelating ligands include, but are not limited to, for example, benzenesulfonic acid, 4-tolyl sulfonic acid, 2,4-diamino-benzosulfonic acid, and etc., and also non-aromatic organic acids, such as itaconic acid, malic acid, malonic acid, tartaric acid, citric acid, oxalic acid, gluconic acid, lactic acid, mandelic acid, or salts thereof. The amount of chelators, or chelating ligands ranges from about 0.01 wt % to about 3.0 wt % relative to the total weight of the barrier CMP composition; preferably from about 0.4 wt % to about 1.5 wt %.

The polishing composition may further comprise a corrosion inhibitor for metal polishing applications. Suitable corrosion inhibitors include, but are not limited to: benzotriazole (BTA) or BTA derivatives, 3-amino-1,2,4-triazole, 3,5-diamine-1,2,4-triazole, other triazole derivatives, and combinations thereof.

The polishing composition includes an oxidizing agent, or oxidizer. The oxidizing agent can be any suitable oxidizing agent. Suitable oxidizing agents include, but are not limited to, one or more peroxy-compounds, which comprise at least one peroxy group (O). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

The CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

Formulations may be made into concentrate and be diluted at the point of use. Alternatively, the formulations can be made into 2 or more multiple components and mixed at the point of use.

WORKING EXAMPLES

Polishing Pad IC1010 pad, supplied by Dow Corporation was used for CMP process.

TEOS oxide films by Chemical Vapor Deposition (CVD) using tetraethylorthosilicate as the precursor HDP oxide films made by high density plasma (HDP) technique SiN films—Silicon nitride films Parameters:

Å: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Removal Rate Selectivity

Removal Rate (RR)=(film thickness before polishing–film thickness after polishing)/polish time.

Removal Rate Selectivity of $A$ over $B$=(RR of $A$)/(RR of $B$)

All percentages are weight percentages unless otherwise indicated.

Particle size distribution measurements were performed using the Disc Centrifuge Particle Size Analyzer (DC24000 UHR from CPS Instruments). Particle size distribution curves were generated based on assumption that particle size density of the composite particles is 3.64 gm/cm$^3$ calculated based on the composition of the particle.

Slurry formulations in subsequent examples use water as the remainder of the slurry formulation.

Example 1. Refining Composite Particles 20 wt % dispersion of ceria coated silica particles (CPOP-20) was obtained from JGC C&C. The particle size of the core silica particle as measured by average diameter measurement by transmission electron microscopy (TEM) was approximately 100 nm. The ceria nanoparticle size as measured by average particle diameter measurement was approximately 13 nm.

The particle dispersion was refined using two methods (1) Filtration; and (2) Fixed Angle Rotational Centrifuge.

Filtration was performed by passing the dispersion through 0.1 µm membrane.

Fixed Angle Rotational Centrifuge (FARC) was operated at 1000 RPM speed for one hour.

Under one condition (RE2003) in Fixed Angle Rotational Centrifuge, 1 liter ceria dispersion was centrifuged and the top 30% fraction (300 milliliters) was extracted for use.

Under another condition (RE2004) in Fixed Angle Rotational Centrifuge, 1 liter ceria dispersion was centrifuged and the top 40% fraction (400 milliliters) was extracted for use.

Figure 2:
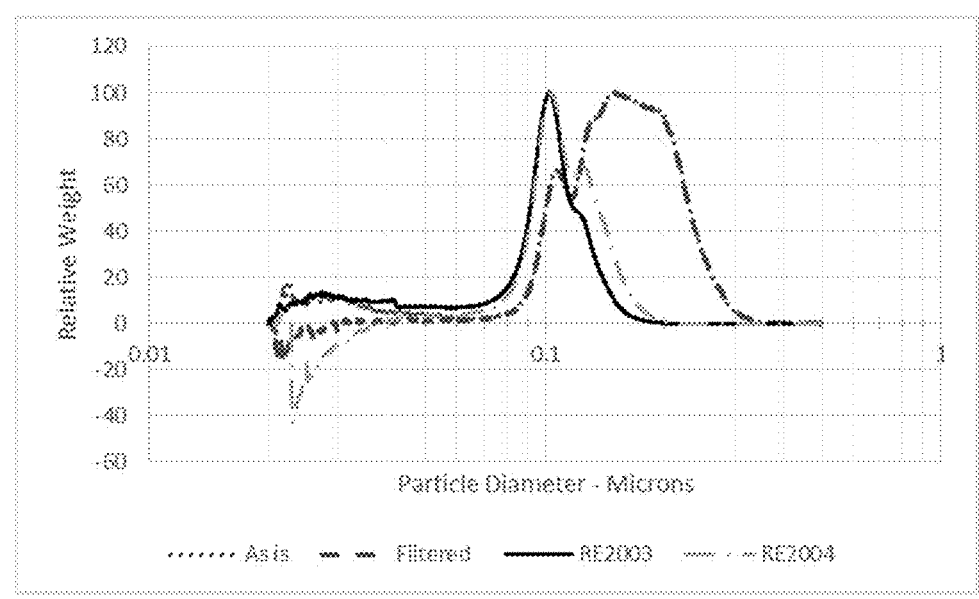
FIG. 2 shows Comparison of particle size distributions with various particle size refinement treatments.

The particle size distributions were displayed in FIG. 2.

TABLE 1

Particle Size Distributions

|  | MPS (nm) | D50 (nm) | D75 (nm) | D99 (nm) |
|---|---|---|---|---|
| No Treatment | 155 | 152.3 | 189.8 | 287.5 |
| RE2003 | 102.5 | 104 | 118.3 | 165.3 |
| RE2004 | 105.7 | 109.1 | 128.6 | 181.1 |
| Filtration | 152.3 | 152 | 190.6 | 287.8 |

Table 1 summarizes the particle size distributions from original CPOP-20 (No treatment), refined CPOP-20 after using Filtration, or FARC as measured by the Disc Centrifuge Particle Size Analyzer (DC24000 UHR from CPS Instruments) (RE2003 and RE2004).

It's clear from FIG. 2 and table 1, that the RE2003 and RE2004 treatments resulted in dramatic decrease in MPS, D50, D75 and D99. For RE2003 and RE2004 treatments resulted, in a decrease in MPS from 155 nm to <106 nm.

The large sized aggregate particles were also drastically reduced as evident from decrease in D99 from 287.5 nm to less than 166 nm for RE2003 and less than 182 nm for RE2004.

Filtration had minimal impact on particle size distribution.

The particle size distribution was also used to calculate the distribution of the particle clusters in terms of number of primary particles.

Table 2 summarized the distribution of particle clusters before and after the FARC treatment.

It's clear as shown in Table 2 that FARC treatment reduced the size of the particle clusters dramatically. Most of the clusters found in the FARC samples had 4 or less (≤4) number of primary particles.

TABLE 2

Particle cluster distribution after the centrifuge treatment

| Particles in | Original | | RE2004 | | RE2003 | |
|---|---|---|---|---|---|---|
| cluster | nm | Wt % | nm | Wt % | nm | Wt % |
| 1 | 107 | 24% | 102 | 59% | 102 | 76% |
| 2 | 130 | 19% | 125 | 27% | 125 | 22% |
| 3 | 147 | 12% | 140 | 7% | >125 | 2% |
| 4 | 159 | 11% | 152 | 7% | | |
| >4 | >159 | 34% | >155 | | | |
|  |  | 100% |  | 100% |  | 100% |

Example 2. CMP Using Refined Composite Particles

The ceria dispersions described in Example 1, the original CPOP-20 (No treatment), refined CPOP-20 after using Filtration, and FARC were used in CMP formulations.

The CMP formulations were formulated with 0.75 wt % ceria coated silica particles, 0.077 wt % ammonium polyacrylate (molecular weight 15000-18000).

pH of CMP formulations was adjusted to 5 using ammonium hydroxide.

TEOS wafers were polished on Reflexion™ LK polisher from Applied Materials™. IC1010™ pad from Dow Chemicals was used for polishing. The platen speed (PS) was 103 RPM and head speed (HS) was 93 RPM. Five zone pressure parameters (RR/Z1/Z2/Z3/Z4/Z5) were set at 11.60/4.70/4.70/4.70/4.70/4.70 psi to provide a uniform downforce across the wafer during polishing.

Removal rates and Within Wafer Removal Rate Non-Uniformity (WWNU (%)) using the CMP formulations were summarized in Table 3.

TABLE 3

Effect of Particle Refinement on Removal rate and Within Wafer Removal Rate Non-Uniformity (WWNU (%))

|  | TEOS RR (Å/min) | WWNU (%) |
|---|---|---|
| RE2003 | 4095 | 13 |
| Filtered | 2235 | 23 |
| No treatment | 2298 | 25 |

Table 3 showed that RE2003 sample obtained from FARC treatment which had lower mean particle size and smaller size distribution offered unexpectedly high removal rates and at the same time provided a very flat removal rate distribution across the wafer surface.

Example 3. CMP Using Refined Composite Particles

CMP slurry formulations were made and tested in the same manner as described in example 2. pH of these formulations was adjusted to 6. Additionally, TEOS wafers were analyzed on AIT-XP™ defect metrology tool from KLA-Tencor. Polishing procedure similar to example 2 was used in these tests.

Table 4 summarized removal rate and defectivity data for these formulations.

TABLE 4

Effect of Particle Refinement on Removal rate and Within Wafer Removal Rate Non-Uniformity

|  | TEOS RR (Å/min) | NU (%) | Defects on TEOS |
|---|---|---|---|
| No Treatment | 1931 | 23.3 | 473 |
| RE2004 | 2407 | 7.6 | 146 |
| RE2003 | 2721 | 8.5 | 49 |

The results confirmed the beneficial effect of reduced particle size on removal rate and non-uniformity. Furthermore, the results showed the beneficial effect of reduced particle size on significant reduction in defects.

Example 4

Three groups A, B and C of ceria coated silica particles were obtained by various particle size distribution refinement techniques. The ceria coated silica particles had similar composite particle characteristics in terms of core silica and ceria nanoparticles covering the core particle.

Table 5 summarized the particle size distribution characteristics of four variants from those three groups of ceria coated silica particles.

TABLE 5

Particle Size Distribution Summary

| | Mean Particle Size (MPS) (nm) | D50 (nm) | D75 (nm) | D99 (nm) |
|---|---|---|---|---|
| A | 161 | 155 | 192 | 297 |
| B | 116 | 114 | 131 | 174 |
| C | 260 | 263 | 358 | 481 |

Figure 3:
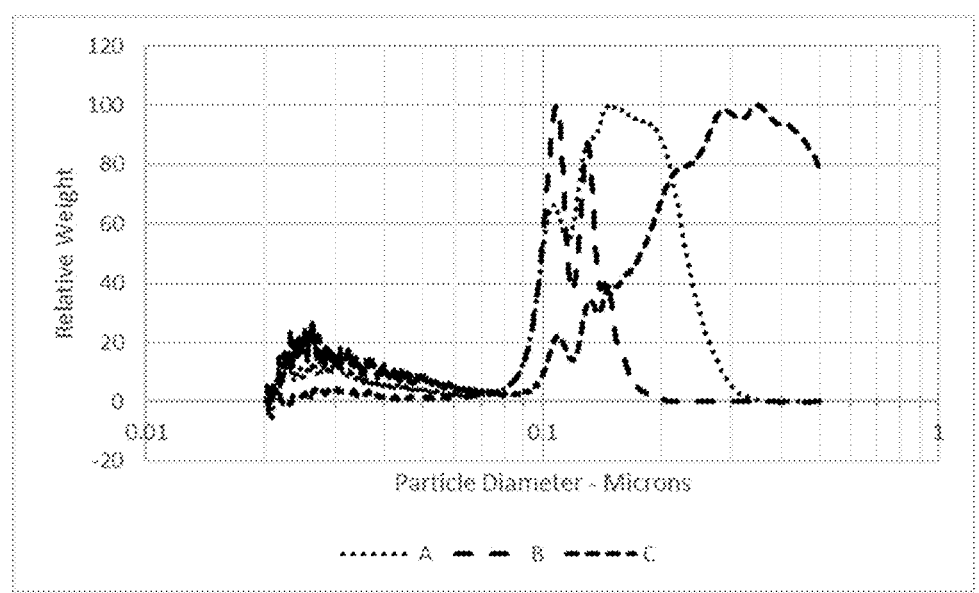
FIG. 3 shows Comparison of particle size distributions from three groups A, B and C of ceria coated silica particles.

FIG. 3 plotted the particle size distribution of those three group of ceria coated silica particles. Particle size distribution B was very narrow with lower MPS, D50, D75 and D99 particle size. There were only two peaks observable in the particle size distribution B, indicating that most of the particles are clusters involving 2 or less (≤2) composite particles. By contrast, particle size distribution A and particle size distribution C showed 4 or more peaks indicating that there was substantial number of particles present with clusters 4 or more composite particles.

CMP slurry formulations were made with 0.5 wt % of the ceria coated silica particles A, B and C. The formulations were pH adjusted using ammonium hydroxide.

Polishing was performed on 200 mm diameter TEOS wafers on Mirra™ polisher from Applier Materials™. IC1010™ pad from Dow Chemicals was used for polishing. Table speed was 87 RPM. Carrier speed was 93 RPM. Down-force was 3.7 psi.

Table 6 summarized the removal rate data of TEOS films.

TABLE 6

TEOS Removal rate data summary

| PSD used in CMP formulation | RR (Å/min) pH 5 | RR (Å/min) pH 6 |
|---|---|---|
| A | 5307 | 4806 |
| B | 7083 | 6653 |
| C | 3515 | 3583 |

The results summarized in table 6 suggest that particle size distribution B with lower D50, D75, D99, MPS and only two peaks in particle size distribution provided unexpectedly high removal rates.

Example 5

CMP slurry formulations were made with 0.5 wt % of the ceria coated silica particles A, B and C as described in example 4. The formulations were pH adjusted to 5 using ammonium hydroxide. Polishing was performed as per conditions described in example 4.

In some of the formulations, 0.1 wt % ammonium polyacrylate (MW 16000-18000) was added.

Table 7 summarizes the removal rate data.

The results showed that with the ammonium polyacrylate addition, silicon nitride removal rate was suppressed. The polymer acted as silicon nitride stopper, thus, optimal combination of high TEOS removal rates and tunable TEOS/SiN removal rate selectivity can be achieved.

TABLE 7

Removal Rate Data Summary

| | No Polymer addition (RR (Å/min)) | | | Ammonium polyacrylate (RR (Å/min)) | | |
|---|---|---|---|---|---|---|
| | TEOS | SiN | Selectivity TEOS/SiN | TEOS | SiN | Selectivity TEOS/SiN |
| A | 4680 | 286 | 16.4 | 1768 | 138 | 12.8 |
| B | 7083 | 1265 | 5.6 | 3566 | 157 | 22.7 |
| C | 3515 | 249 | 14.1 | 1417 | 140 | 10.1 |

The results summarized in table 7 also suggested that particle size distribution with lower D50, D75, D99 and MPS result in higher TEOS/SiN removal rate selectivity.

The results also demonstrated that polishing formulations offered polish rates of silicon oxide at greater than 2000 Angstroms/min. while gave polish rates of silicon nitride less than 160 Angstroms/min.

Example 6

CMP slurry formulation was made with 0.5 wt % of the ceria coated silica particles B and 0.1 wt % ammonium polyacrylate (MW 16000-18000) as described in example 5. The formulation was pH adjusted to 6 using ammonium hydroxide. Polishing was performed as per conditions described in example 5.

TABLE 8

Removal Rate (Å/min) Summary

| | TEOS | SiN | TEOS/SiN Selectivity |
|---|---|---|---|
| B | 3714 | 79 | 47 |

Table 8 summarized the removal rate data. The results showed that by increasing pH to 6, selectivity of TEOS to nitride was further improved to 47.

The present invention has demonstrated that composite particles with lower mean particle size and smaller size distribution could be obtained through refining treatments. The refined composite particles were used in CMP compositions to offer higher removal rate; very low within wafer (WWNU) for removal rate, low dishing and low defects.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A chemical mechanical planarization (CMP) polishing composition, comprising
    0.01 wt. % to 20 wt. % of composite particles comprise single ceria coated silica particles and aggregated ceria coated silica particles; wherein >0 and ≤7 wt. % of the composite particles are aggregated ceria coated silica particles comprising at least 3 single ceria coated silica particles;

water;
pH of the CMP composition ranges from about 2 to about 12; and
optionally
0.0001 wt % to about 5 wt % of a pH adjusting agent selected from the group consisting of sodium hydroxide, cesium hydroxide, potassium hydroxide, cesium hydroxide, ammonium hydroxide, quaternary organic ammonium hydroxide, and combinations thereof;
0.000001 wt % to 0.5 wt % of a chemical additive elected from the group consisting of a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
0.0001 wt % to about 10 wt % of a surfactant selected from the group consisting of a). Non-ionic surface wetting agents; b). Anionic surface wetting agents; c). Cationic surface wetting agents; d). ampholytic surface wetting agents; and combinations thereof;
0.001 wt % to 5 wt % of water soluble polymer selected from the group consisting of anionic polymer, cationic polymer, non-ionic polymer, and combinations thereof;
0.01 wt % to 3.0 wt % of chelators;
corrosion inhibitor;
oxidizer; and
biological growth inhibitor.

2. The chemical mechanical planarization (CMP) polishing composition of claim 1, wherein the CMP polishing composition having pH from 3.5 to 10.

3. The chemical mechanical planarization (CMP) polishing composition of claim 1,
wherein the composite particles have a feature selected from the group consisting of
(a) 99 wt % of the composite particles have particle size less than 250 nm;
(b) the composite particles have mean particle size less than 150 nm; and the mean particle size is the weighted average of particle diameters; and
(c) combination thereof.

4. The chemical mechanical planarization (CMP) polishing composition of claim 1, wherein the composite particles have a feature selected from the group consisting of
(a) >0 and ≤2 wt. % of the composite particles are aggregated ceria coated silica particles comprising at least 3 single ceria coated silica particles;
(b) 99 wt % of the composite particles have particle size less than 200 nm;
(c) the composite particles have mean particle size less than 125 nm or 110 nm; and
(d) combinations thereof.

5. The chemical mechanical planarization (CMP) polishing composition of claim 1,
wherein the CMP polishing composition comprising ceria coated silica particles, ammonium polyacrylate (molecular weight 15000-18000); the pH between 4 and 7; and >0 and ≤7 wt. % of the composite particles are aggregated ceria coated silica particles comprising at least 3 single ceria coated silica particles.

6. A polishing method for chemical mechanical planarization (CMP) of a semiconductor substrate comprising at least one surface having at least one oxide layer, comprising the steps of:
a) contacting the at least one oxide layer with a polishing pad;
b) delivering a CMP polishing composition to the at least one surface, and
c) polishing the at least one oxide layer with the CMP polishing composition;
wherein the CMP polishing composition comprises
0.01 wt. % to 20 wt. % of composite particles comprise single ceria coated silica particles and aggregated ceria coated silica particles; wherein >0 and ≤7 wt. % of the composite particles are aggregated ceria coated silica particles comprising at least 3 single ceria coated silica particles;
water;
pH of the CMP composition ranges from about 2 to about 12; and
optionally
0.0001 wt % to about 5 wt % of a pH adjusting agent selected from the group consisting of sodium hydroxide, cesium hydroxide, potassium hydroxide, cesium hydroxide, ammonium hydroxide, quaternary organic ammonium hydroxide, and combinations thereof;
0.000001 wt % to 0.5 wt % of a chemical additive elected from the group consisting of a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
0.0001 wt % to about 10 wt % of a surfactant selected from the group consisting of a Non-ionic surface wetting agents; b). Anionic surface wetting agents; c). Cationic surface wetting agents; d). ampholytic surface wetting agents; and mixtures thereof;
0.001 wt % to 5 wt % of water soluble polymer comprising anionic polymer, cationic polymer, non-ionic polymer, and combinations thereof;
0.01 wt % to 3.0 wt % of chelators;
corrosion inhibitor;
oxidizer; and
biological growth inhibitor.

7. The polishing method of claim 6, wherein the composite particles have a feature selected from the group consisting of
(a) 99 wt % of the composite particles have particle size less than 250 nm;
(b) the composite particles have mean particle size less than 150 nm; and the mean particle size is the weighted average of particle diameters; and
(c) combination thereof.

8. The polishing method of claim 6, wherein the composite particles have a feature selected from the group consisting of
(a) >0 and ≤2 wt. % of the composite particles are aggregated ceria coated silica particles comprising at least 3 single ceria coated silica particles;

(b) 99 wt % of the composite particles have particle size less than 200 nm;
(c) the composite particles have mean particle size less than 125 nm or 110 nm; and
(d) combinations thereof.

9. The polishing method of claim 6, wherein the CMP polishing composition comprising ceria coated silica particles, ammonium polyacrylate (molecular weight 15000-18000); and the pH between 4 and 7; >0 and ≤7 wt. % of the composite particles are aggregated ceria coated silica particles comprising at least 3 single ceria coated silica particles; 99 wt % of the composite particles have particle size less than 200 nm; and the composite particles have mean particle size less than 125 nm.

10. The polishing method of claim 6, wherein the semiconductor substrate further comprising a nitride layer and removal selectivity of the at least one oxide layer over the nitride layer is more than 10.

11. The polishing method of claim 10, wherein the at least one oxide layer is TEOS and the semiconductor substrate further comprising a silicon nitride layer and removal selectivity of TEOS over silicon nitride layer is more than 20.

* * * * *